United States Patent
Zhang et al.

(10) Patent No.: US 6,905,908 B2
(45) Date of Patent: Jun. 14, 2005

(54) METHOD OF FABRICATING ORGANIC FIELD EFFECT TRANSISTORS

(75) Inventors: Jie Zhang, Buffalo Grove, IL (US); Daniel Gamota, Palatine, IL (US); Min-Xian Zhang, Inverness, IL (US); Paul Brazis, South Elgin, IL (US); Krishna Kalyanasundaram, Chicago, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/329,595

(22) Filed: Dec. 26, 2002

(65) Prior Publication Data

US 2004/0126935 A1 Jul. 1, 2004

(51) Int. Cl.[7] .................................................. H01L 5/40
(52) U.S. Cl. ........................... 438/99; 438/197; 438/158
(58) Field of Search .......................... 438/99, 197, 199, 438/158, 151, 149, 459, 778, 200, 201, 198, 166, 780; 257/40, 347

(56) References Cited

U.S. PATENT DOCUMENTS

| | | | | |
|---|---|---|---|---|
| 5,381,027 A | * | 1/1995 | Usagawa et al. | 257/192 |
| 5,500,537 A | * | 3/1996 | Tsumura et al. | 257/40 |
| 5,854,139 A | * | 12/1998 | Aratani et al. | 438/780 |
| 5,892,244 A | * | 4/1999 | Tanaka et al. | 257/40 |
| 5,953,595 A | * | 9/1999 | Gosain et al. | 438/158 |
| 6,284,562 B1 | * | 9/2001 | Batlogg et al. | 438/99 |
| 6,285,055 B1 | * | 9/2001 | Gosain et al. | 257/317 |
| 6,312,304 B1 | * | 11/2001 | Duthaler et al. | 445/24 |
| 6,335,539 B1 | * | 1/2002 | Dimitrakopoulos et al. | 257/40 |
| 6,344,660 B1 | * | 2/2002 | Dimitrakopoulos et al. | 257/40 |
| 6,376,290 B1 | * | 4/2002 | Gosain et al. | 438/166 |
| 6,555,411 B1 | * | 4/2003 | Bao et al. | 438/99 |
| 6,596,569 B1 | * | 7/2003 | Bao et al. | 438/151 |
| 6,635,508 B2 | * | 10/2003 | Arai et al. | 438/99 |
| 6,661,024 B1 | * | 12/2003 | Zhang et al. | 257/40 |
| 6,740,900 B2 | * | 5/2004 | Hirai | 257/40 |

* cited by examiner

*Primary Examiner*—Laura M Schillinger

(57) ABSTRACT

Organic field effect transistors (OFETs) can be created rapidly and at low cost on organic films by using a multi-layer film (202) that has an electrically conducting layer (204, 206) on each side of a dielectric core. The electrically conducting layer is patterned to form gate electrodes (214), and a polymer film (223) is attached onto the gate electrode side of the multilayer dielectric film, using heat and pressure (225) or an adhesive layer (228). A source electrode and a drain electrode (236) are then fashioned on the remaining side of the multilayer dielectric film, and an organic semiconductor (247) is deposited over the source and drain electrodes, so as to fill the gap between the source and drain electrodes and touch a portion of the dielectric film to create an organic field effect transistor.

5 Claims, 3 Drawing Sheets

ID OF FABRICATING ORGANIC
FIELD EFFECT TRANSISTORS

This invention was made with United States Government support under Agreement No. 70NANB0H3033 awarded by the National Institute of Standards and Technology (NIST). The United States Government has certain rights in the invention.

FIELD OF THE INVENTION

This invention relates generally to organic field effect transistors. More particularly, this invention relates to low cost methods of creating organic field effect transistors.

BACKGROUND OF THE INVENTION

Field effect transistors (FETs) are transistors in which the resistance of the current path from source to drain is modulated by applying a transverse electric field between grid or gate electrodes. The electric field varies the thickness of the depletion layer between the gates, thereby modifying the conductance. Organic field effect transistors (OFETs) utilize an organic semiconductor channel, such as polythiophene compounds, in place of conventional inorganic semiconducting materials. An OFET as generally practiced in the prior art is depicted in FIG. 1, where a gate electrode 20 is situated on a substrate 10, a gate dielectric layer 30 is disposed over the gate electrode 20, an organic semiconductor layer 40 used as an active layer of the transistor contacts the gate dielectric layer, and source and drain electrodes 50 and 60 also contact the organic semiconductor layer 40. The gate electrode 20 is typically formed in the organic transistor forming region by depositing a gate metal such as Cr/Au or Ti/Au and the thickness of the gate electrode 20 is typically about 1000 Ångstroms. On the gate electrode 20 in the transistor region, a dielectric layer 30 that insulates the gate electrode from other members is made of a non-conducting substance and is formed by a vacuum evaporation or a spin coating method with a nominal thickness of 3 micrometers or less and a conductivity less than 10E-14 ohm/cm. The organic semiconductor layer 40 used as an active layer of the transistor is deposited by a spin coating or vacuum deposition method on the gate-insulating layer 30. Preferably, the thickness of the organic semiconductor layer 40 is less than 100 nm. The organic semiconductor layer 40 of the OFET can be made of a charge transfer complex or a thiophene polymer in order to enhance the mobility and the driving current of the field effect transistor. Some examples of charge transfer complexes are copper phthalocyanine, bis(tetra-n-butylammonium)palladium (II), and 7,7,8,8-tetracyano-p-quinodimethane. Then, a gold film with high electrical conductivity is patterned to form a source electrode 50 and a drain electrode 60.

These OFET fabrication methods are based on traditional silicon wafer deposition and other conventional vacuum deposition processes, which include sequential deposition of materials onto a single substrate. This processing occurs in a single, controlled manufacturing environment (e.g., clean room, vacuum chamber etc.). Depending on OFET design, three to five layers of materials are required to make a device. Sequential multiple layer deposition requires strict chemical and process compatibility for adjacent materials, long cycle time for layer-to-layer deposition, and post processing of each layer. These requirements significantly restrict materials selection and process adaptability of organic integrated circuit manufacturing. It would be a significant contribution to the art if a lower cost method of creating OFETs were developed that did not require such stringent process conditions.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
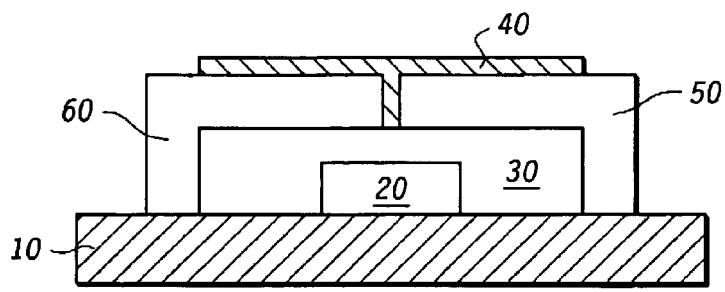
FIG. 1 is a cross-sectional schematic representation of an organic field effect transistor as practiced in the prior art.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 2:
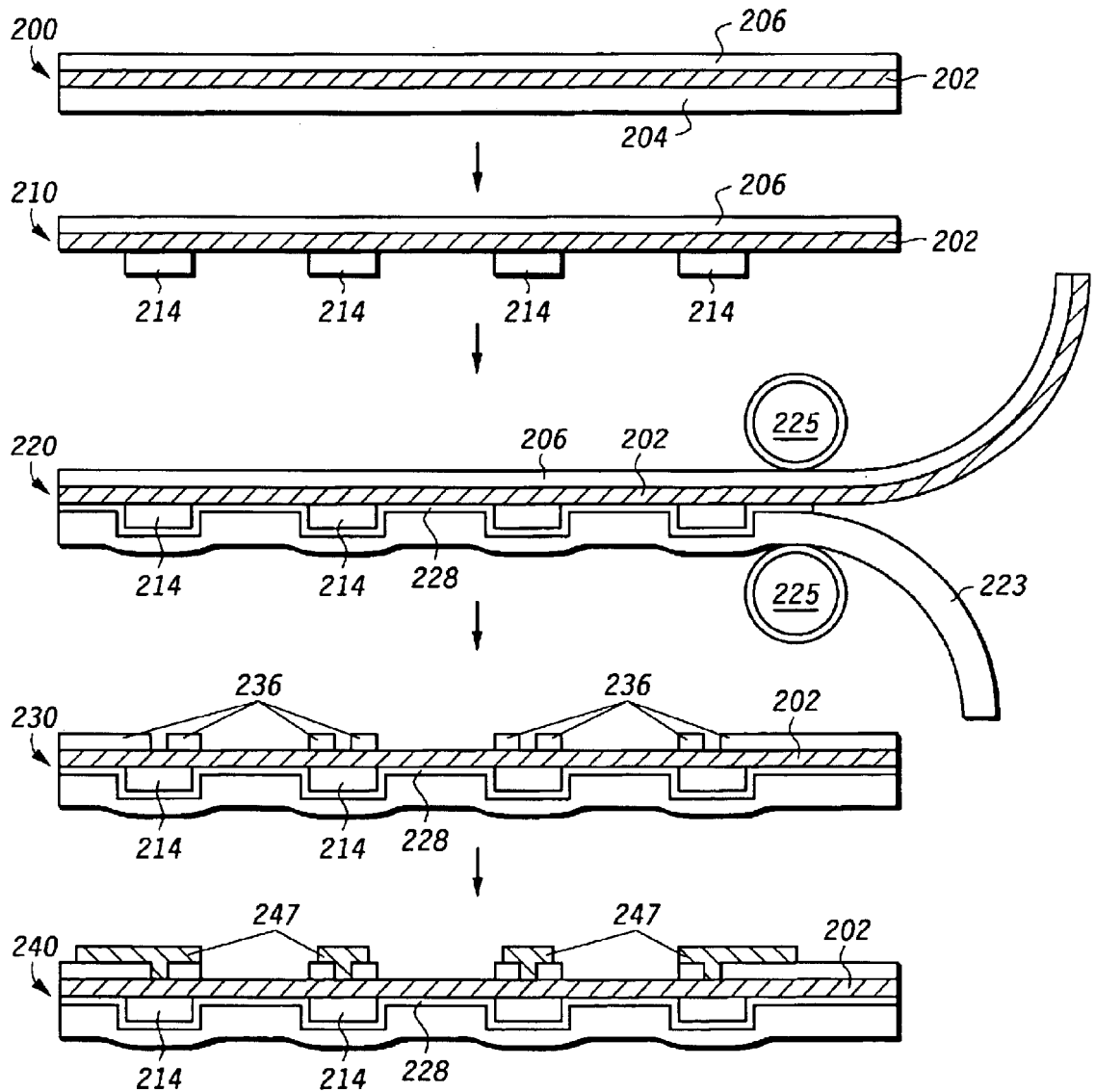
FIGS. 2–5 are side view schematic representations of methods of fabricating organic field effect transistors in accordance with various embodiments of the present invention.

Organic field effect transistors (OFETs) can be created rapidly and at low cost on organic films by using a multilayer film that consist of a dielectric layer as core and an electrically conducting layer on each side. The electrically conducting layer is patterned to form a gate electrode, and a polymer film is added onto the gate electrode side of the multilayer film as a mechanical support. A source electrode and a drain electrode are then fashioned on the remaining side of the multilayer film, and an organic semiconductor is deposited over the source and drain electrodes, so as to fill the gap between the source and drain electrodes and touch a portion of the dielectric film to create an organic field effect transistor. While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings. Referring now to FIG. 2 where we depict one method to create a plurality of OFETs in a parallel patterning process, in step 200 a dielectric film 202 has a layer of an electrically conducting material 204 on one side that will be used to form gate electrode and an additional layer of electrically conducting material 206 on an opposite side that will ultimately be used to form source and drain electrodes. In an alternative embodiment, the additional layer 206 can be added to the multilayer film a later step, if desired. The film 202 is preferably less than 10 microns thick, and can be any of a number of dielectric materials, such as paper or polymers (polycarbonate, polyimide, polyester, polyamide, polyamide-imide, polyarylsulfone, or polyetherimide to name only a few), or ceramic filled polymers (photoimageable and non-photoimageable), or metal oxides such as tantalum oxide (Ta2O5), lead lanthanum zircornate titanate (PLZT), lead calcium zircornate titanate (PCZT), aluminum oxides, titanium oxides, etc. The electrically conducting layers 204, 206 can be metal such as aluminum, copper, nickel, gold, tin, indium, etc., or a conductive polymer such as polyaniline. The gate electrodes 214 are formed in a patterning step 210 by removing selected portions of the metal layer 204 by using well-known conventional techniques, such as print-and-etch. A polymer film 223 is then attached 220 to the gate electrode side of the multilayer film by using, for example, by heated rollers 225 to apply heat and, optionally, pressure. The polymer film 223 is generally greater than 5 microns thick and preferably is 25 microns or more, and acts as a 'rigidizer' to provide mechanical support to the thinner dielectric layer 202. In addition, the polymer film 223 acts as a moisture, oxygen and light barrier for OFET package. The heat and pressure thermally bonds or heat stakes the polymer film to the multilayer film. Optionally, one can add an adhesive material 228 to the interface between the polymer film and the gate electrode side prior to bonding, to create a more robust bond and greater contact. This technique allows one to create a large number of OFETs by using a long ribbon of the raw materials in, for example, a reel-to-reel format. In an alternate embodiment, one could batch-process sheets of raw material using platens, thus creating a two-dimensional array of OFETs. After processing, source and drain electrodes 236 are created in step 230 from the electrically conducting layer 206 on the remaining side of the multilayer film. This can be accomplished in several ways, by, for example by removing selected portions of the conductive layer 206 by using well known conventional patterning techniques, such as print-and-etch or plasma etching. If the second electrically conducting layer 206 was not present at the outset, as in the alternate embodiment mentioned above, one could additively plate up or add conducting material at this point in selected locations to create the source and drain electrodes 236. Following the formation of the source and drain electrodes 236, in step 240 an organic semiconducting material 247 such as a charge transfer complex or a thiophene polymer is deposited over the source and drain electrodes 236 to create the OFET. One skilled in the art will appreciate that the organic semiconducting material 247 fills the gap between the source and drain electrodes 236 and also contacts portions of the dielectric film.

Our use of functional flexible substrates that can be processed independently enables mass-production of OFETs using reel-to-reel techniques. The functional flexible films and the manufacturing processes to create the electrodes and other processing techniques are currently in use for electronics manufacturing, and thus are readily available for OFET fabrication. The use of a rigidizer provides mechanical support to the structure during the processing, allowing the use of a very thin dielectric layer between the gate electrode and the source/drain electrodes, which is critical for OFET performance. Our invention eliminates material, chemical, and post-process compatibility issues experienced by prior art sequential multiple layer deposition processes.

Figure 3:
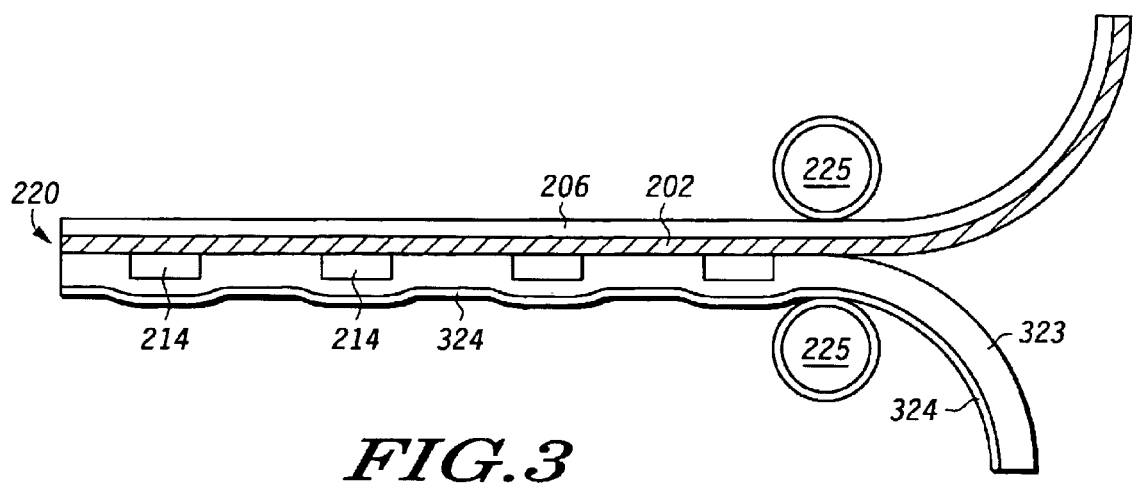

Referring now to FIG. 3 where we depict an alternate embodiment of our invention, during the step 220, the polymer film 323 contains a thin metal layer 324 on the side that is opposite to the side that is attached against the patterned gate electrodes 214. One example of a suitable film is metallized polyester film, such as MYLAR®. MYLAR® with a sputtered or evaporated coating of metal on one side is a readily available material, and the physical toughness of metallized MYLAR® allows the polymer film 323 to be relatively thin while providing a highly effective moisture barrier, oxygen barrier, and light barrier for the gate electrodes.

Figure 4:
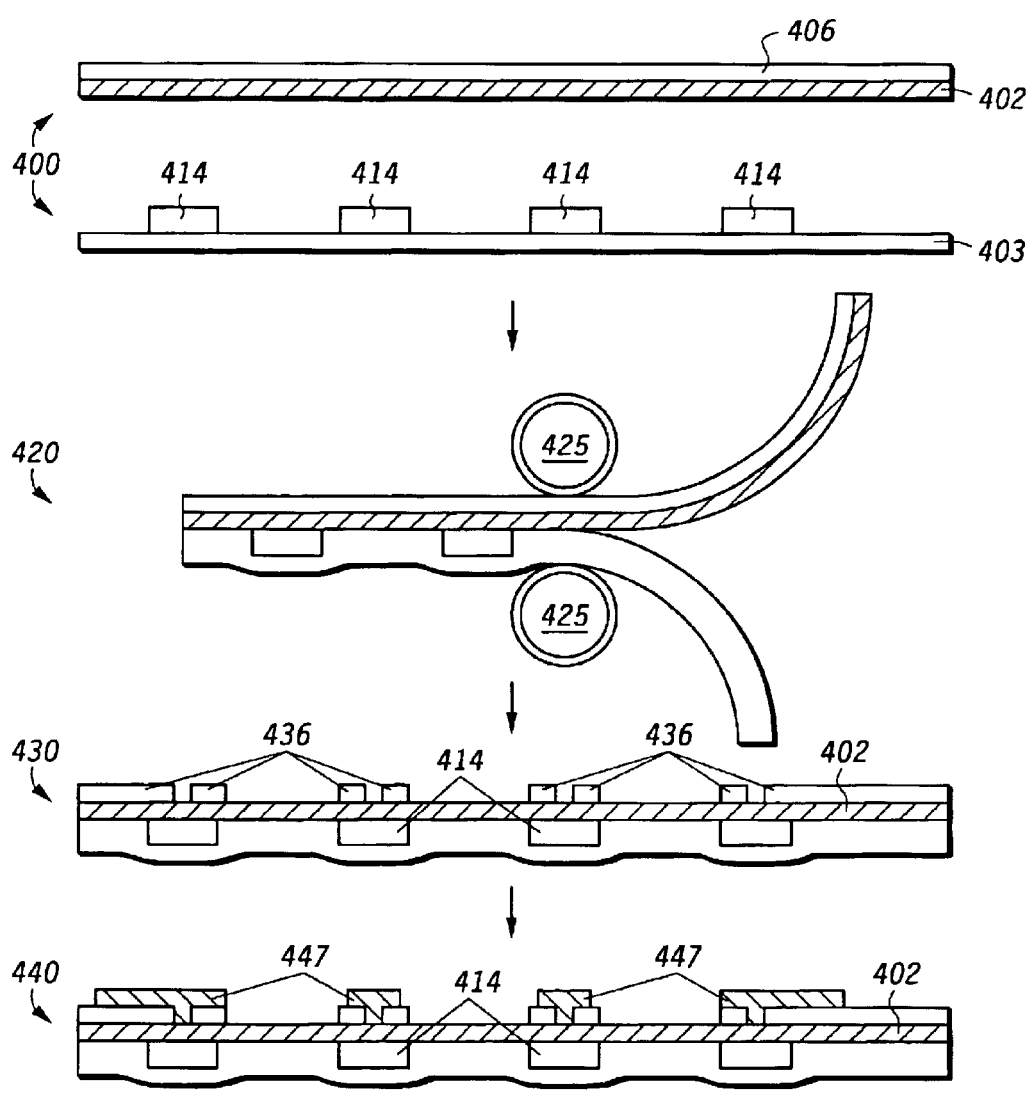

Referring now to FIG. 4 where we depict another alternate embodiment of our invention, in step 400 a first dielectric film 402 has a layer of an electrically conducting material 406 on one side. The film 402 is preferably less than 10 microns thick, and can be any of a number of dielectric materials, such as paper or polymers (polycarbonate, polyimide, polyester, polyamide, polyamide-imide, polyarylsulfone, polyetherimide, etc.) or it can be an oxide or oxides. The electrically conducting layer 406 can be a metal, such as aluminum copper, nickel, gold, tin, indium, etc., or a conductive polymer such as polyaniline. A second dielectric film 403 has a plurality of gate electrodes 414 patterned on one side. In step 420 the dielectric side of the first dielectric film 402 is then attached to the gate electrode 414 side of the second dielectric film 403 by using, for example, heated rollers 425 to apply heat and, optionally, pressure. In this manner, the two films are thermally bonded or heat staked together. As above, one could optionally add an adhesive material to the interface prior to bonding to create a more robust bond. After assembly, source and drain electrodes 436 are created 430 on the remaining side of the multilayer dielectric film. Following the formation of the source and drain electrodes, an organic semiconducting material 447 is deposited over the source and drain electrodes 436 in step 440 to create the OFET. One skilled in the art will appreciate that the organic semiconducting material 447 must fill the gap between the source and drain electrodes 436.

Figure 5:
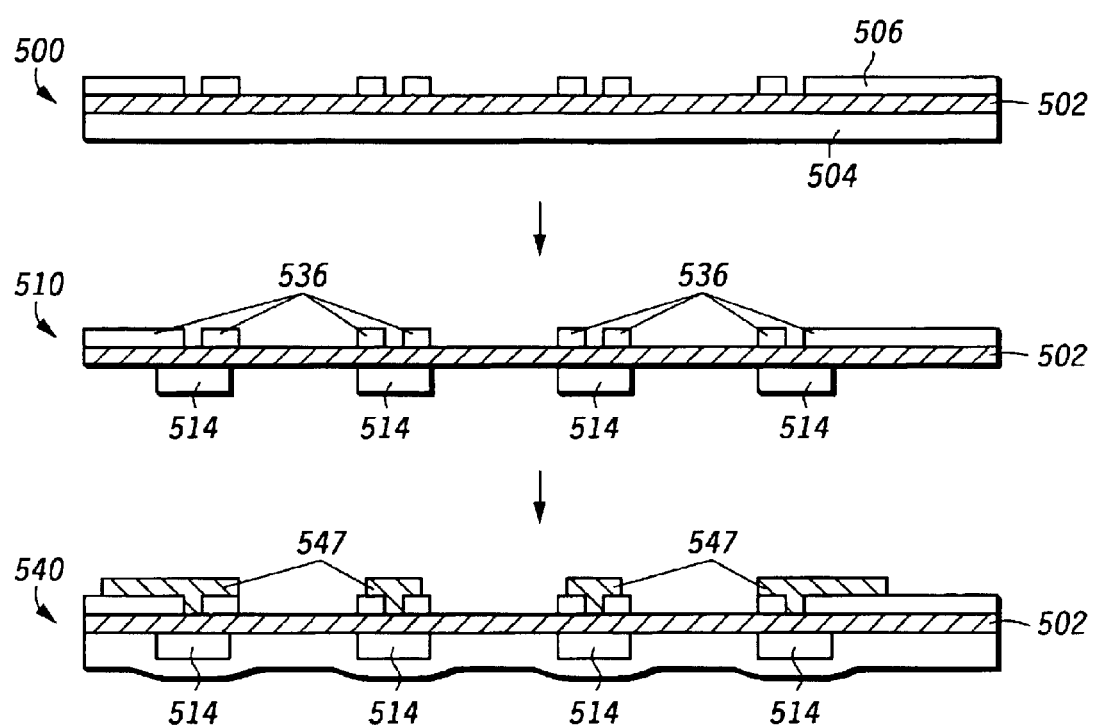

Referring now to FIG. 5 where we depict yet another embodiment of our invention, in step 500 a dielectric film 502 has a layer of an electrically conducting material 504 on one side using as gate and an additional layer 506 of electrically conducting material on the side opposite to of the electrical layer 504, that will ultimately be used to form source and drain electrodes. In a variation of this embodiment, the additional layer 506 can be added to the multilayer film a later step, if desired. The film 502 is preferably less than 10 microns thick, and can be any of a number of dielectric materials, such as paper or polymers (polycarbonate, polyimide, polyester, polyamide, polyamide-imide, polyarylsulfone, or polyetherimide to name only a few) or it can be an oxide. The electrically conducting layers 504, 506 can be metal, such as aluminum, copper, nickel, gold, tin, indium, etc., or a conductive polymer such as polyaniline. The gate electrodes 514 and the source and drain electrodes 536 are formed in one or more patterning steps 510 by removing selected portions of the conductive layers 504, 506 by using well known conventional techniques. An organic semiconducting material 547 such as a charge transfer complex or a thiophene polymer is deposited over the source and drain electrodes 536 in step 540 to create the OFET. One skilled in the art will appreciate that the organic semiconducting material 547 fills the gap between the source and drain electrodes 536 and also contacts portions of the dielectric film.

In summary, without intending to limit the scope of the invention, our invention utilizes functional freestanding films and conventional processing methods to mass-produce organic integrated circuits. The freestanding films have dielectric, metallic, and/or semiconducting layers that can be patterned by a variety of methods as known by those skilled in the art. We employ a processing method using multiple functional freestanding films. One embodiment begins with a first film having patterned conductors, which serve as gate electrodes and interconnects. The second film is a dielectric with a conductive layer on one side, and it provides both the gate dielectric and the source/drain electrodes. The first film is then attached to the second film by placing the gate electrode side of the first film against the dielectric side of the second film, and the composite structure is then patterned to form source/drain electrodes and interconnects. An organic semiconductor is then coated over the source/drain electrodes to complete the OFET. The various films provide oxygen, moisture, and light barriers and mechanical support to the OFET. The films can be low-cost metallized paper or plastic films, metal oxides, fluoropolymers, etc. Since the dielectric is very thin and pinhole free, these qualities are easy to control on a uniform surface.

While the invention has been described in conjunction with specific embodiments, it is evident that many alternatives, modifications, permutations and variations will become apparent to those of ordinary skill in the art in light of the foregoing description. For example, one of the films can be pre-coated with a sufficiently thick layer of organic semiconducting material. Accordingly, it is intended that the present invention embrace all such alternatives, modifications and variations as fall within the scope of the appended claims.

What is claimed is:

1. A method of fabricating organic field effect transistors, comprising:

a) providing a first dielectric him having an electrical conductor on a first side thereof;

b) providing a second dielectric film having an electrical conductor on a first side thereof;

c) forming a gate electrode on the first side of the second dielectric film;

d) laminating the first side of the second dielectric film to a second side of the first dielectric film;

e) forming a source electrode and a drain electrode on the first side of the first dielectric film; and f) depositing an organic semiconductor over the source and drain electrodes, so as to create an organic field effect transistor.

2. The method as described in claim 1, wherein step (f) comprises depositing the organic semiconductor over the source and drain electrodes and over a portion of the first dielectric film.

3. The method as described in claim 1, wherein step (b) further comprises providing a second dielectric film having a barrier coating on a second side.

4. The method as described in claim 1, wherein step (d) comprises laminating with heat and pressure, or laminating with an adhesive.

5. The method as described in claim 1, wherein a plurality of organic field effect transistors are formed in an array format.

* * * * *